(12) United States Patent
Chen et al.

(10) Patent No.: US 6,762,439 B1
(45) Date of Patent: Jul. 13, 2004

(54) DIODE FOR POWER PROTECTION

(75) Inventors: Shui-Hung Chen, Hsin-chu (TW);
Jian-Hsing Lee, Hsin-chu (TW);
Jiaw-Ren Shih, Hsin-chu (TW);
Ta-Lee Yu, Hsin-chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/898,386

(22) Filed: Jul. 5, 2001

(51) Int. Cl.$^7$ ............... H01L 29/74; H01L 23/62
(52) U.S. Cl. ............... 257/173; 257/355; 361/56
(58) Field of Search ............... 257/355–363, 257/173–174; 361/56

(56) References Cited

U.S. PATENT DOCUMENTS

| | | | | |
|---|---|---|---|---|
| 4,327,368 A | * | 4/1982 | Uchida | 357/42 |
| 5,530,612 A | | 6/1996 | Maloney | 361/56 |
| 5,742,085 A | * | 4/1998 | Yu | 257/360 |
| 5,747,834 A | | 5/1998 | Chen et al. | 257/111 |
| 5,767,537 A | * | 6/1998 | Yu et al. | 257/111 |
| 5,898,205 A | | 4/1999 | Lee | 257/355 |
| 5,949,094 A | * | 9/1999 | Amerasekera | 257/173 |
| 5,959,821 A | * | 9/1999 | Voogel | 361/111 |
| 6,002,568 A | | 12/1999 | Ker et al. | 361/111 |
| 6,011,681 A | | 1/2000 | Ker et al. | 361/111 |
| 6,016,002 A | * | 1/2000 | Chen et al. | 257/546 |

FOREIGN PATENT DOCUMENTS

JP      5-90520     * 4/1993     ......... H01L/27/092

* cited by examiner

*Primary Examiner*—Ori Nadav
(74) *Attorney, Agent, or Firm*—George O. Saile; Stephen B. Ackerman; Douglas R. Schnabel

(57) ABSTRACT

A new electrostatic discharge protection device is achieved. A p-well region is in a semiconductor substrate. An n+ region in the p-well region is connected to a first voltage supply. An n-well region in the p-well region is spaced from the n+ region such that a depletion region will extend therebetween during normal operation. A p+ region in the n-well region is connected to a second voltage supply of greater value than the first voltage supply during normal operation. Current is conducted through the n+ region to the p+ region during an electrostatic discharge event.

20 Claims, 6 Drawing Sheets

DIODE FOR POWER PROTECTION

BACKGROUND OF THE INVENTION (1) Field of the Invention

The invention relates to a device for protecting integrated circuits from electrostatic discharge (ESD), and more particularly, to a novel diode device for ESD protection in multiple supply applications.

(2) Description of the Prior Art

The fabrication of disparate functions onto single integrated circuit chips often requires that more than one voltage supply be used. For example, an integrated circuit device may have a low voltage section wherein very small MOS logic transistors are powered from a low voltage supply. This same integrated circuit device may contain analog circuits or input/output (I/O) circuits that are powered by a high voltage supply. In these cases, special design and layout consideration must be used to handle these differing voltage supplies on the chip. In addition, interface circuits, such as level shifting circuits, provide special challenges to insure that the integrated circuit device is not damaged during normal operation or during special transient conditions.

Electrostatic discharge (ESD) is of particular concern for integrated circuits containing more than one voltage supply. ESD events occur primarily due to handling of the integrated circuit by machines or by people. During an ESD event, a large electrostatic potential can develop between pins of the device. When the potential is discharged, energy is dissipated within the device and can result in catastrophic damage to the chip. ESD protection devices are designed on each input and output pin to provide conductive paths between the pin and ground or the pin and the voltage supply during the large voltage transient associate with the ESD event. These protection devices are typically sufficient to protect the I/O pads of the single supply chip. However, when more than one voltage supply pin is used, the ESD protection devices must be modified or additional protection structures must be added.

Referring now to FIG. 1, a partial top view of a prior art integrated circuit device 10 is illustrated. In this device 10, three pads 12, 14, and 16 are shown. In this case, the device 10 uses two voltage supplies, VCC1 and VCC2. In normal operation, the VCC1 voltage is connected to the VCC1 pad 16 and the VCC2 voltage is connected to the VCC2 pad 14. An additional ESD protection device 22 is added to the integrated circuit device 10. This additional ESD protection device 22 is illustrated as a diode 22. The third pad, GND 12, is connected to the ground reference for the system using the integrated circuit device.

Referring now to FIG. 2, a cross-section of an exemplary diode protection device is shown. This device comprises a p-well region 26 in the semiconductor substrate. In practice, the entire semiconductor substrate may be a lightly doped p-type region 26. The p-well region 26 is connected to the GND pad 32. An n-well region 34 is formed in the p-well region 26. An n+region 42 and a p+ region 38 are formed in the n-well region. The n+ region 42 is connected to the VCC1 supply 44, and the p+ region 38 is connected to the VCC2 supply 40. A p-n junction is formed by the p+ region 38 and the n-well region 34. This p-n junction forms the p-n diode 22 that is shown in both FIGS. 1 and 2. This diode structure 22 provides isolation between the VCC2 supply 40 and the VCC1 supply 44 assuming that VCC2 is greater than VCC1 by an amount of less than the diode turn on voltage (Vt) that is typically about 0.7 Volts. When an ESD event occurs, the diode provides a current path between the voltage supply pins that protects the internal circuitry from damage. A distinct disadvantage of the device of FIG. 2 is that VCC2 supply can only be a maximum of about 0.7 Volts greater than the VCC1 supply.

Referring now to FIG. 3, the useful operating range of the diode device of FIG. 2 can be extended by creating a string of diodes. In this prior art device, two n-well regions 66 and 78 are formed. A first diode 80 is formed in the first n-well region 66 by the p-n junction formed by the p+ region 62 and the n-well region 66. The p-terminal 62 of the first diode 80 is connected to the higher voltage source, VCC2 64. The n-terminal, formed as the n+ regions 58, of the first diode 80 is connected to the p-terminal 74 of the second diode 88. The n-terminal, formed by the n+ regions 70, of the second diode 88 is then connected to the lower voltage source, VCC1 72. Note that the presence of the n-well regions 66 and 78 in the p-well region 48 actually creates a chain of two p-n-p transistors with two diode drops between VCC2 and VCC1. This means that the diode string configuration allows for the VCC2 voltage to exceed the VCC1 voltage by two diode drops, or about 1.4 Volts.

Referring now to FIG. 4, the prior art diode string concept is shown in the general configuration wherein a large string of p-n-p transistors 112, 116, 120, and 124 are used in the case where a large voltage difference exists between VCC2 100 and VCC1 104. The diode string approachs used in FIGS. 3 and 4 have the disadvantage of requiring a lot of area to form the separate n-well regions for each stage of the string. In addition, the conductivity of the diodes during an ESD event is not optimal.

Several prior art inventions describe ESD devices and circuits. U.S. Pat. No. 6,002,568 to Ker et al discloses an ESD circuit using silicon controlled rectifier (SCR) devices. U.S. Pat. No. 5,898,205 to Lee teaches an ESD protection circuit where conventional CMOS protection transistors are capacitively-coupled to improve performance. U.S. Pat. No. 6,011,681 to Ker et al discloses a circuit using bi-directional SCR devices to provide current discharge paths between separate power supplies. U.S. Pat. No. 5,530,612 to Maloney teaches ESD protection circuits using biased diode strings and cantilevered diode strings. U.S. Pat. No. 5,747,834 to Chen et al discloses a bipolar SCR with an adjustable holding voltage wherein the device is entirely constructed in an n-well and uses a buried layer.

SUMMARY OF THE INVENTION

A principal object of the present invention is to provide an effective and very manufacturable integrated circuit device for protecting the integrated circuit from electrostatic discharge (ESD) events.

A further object of the present invention is to provide an ESD protection device that is effective as a discharge path between voltage supply pins on the same integrated circuit device.

A yet further object of the present invention is to provide an ESD protection device that is suitable for applications wherein a large voltage difference exists between the voltage supply pins.

A still further object of the present invention is to provide an ESD protection device that is suitable for large voltage differences between the voltage supply pins and that can be integrated in a single n-well of small area.

In accordance with the objects of this invention, a new electrostatic discharge protection device is achieved. A p-well region is in a semiconductor substrate. An n+ region in the p-well region is connected to a first voltage supply. An n-well region in the p-well region is spaced from the n+ region such that a depletion region will extend therebetween during normal operation. A p+ region in the n-well region is connected to a second voltage supply of greater value than the first voltage supply during normal operation. Current is conducted through the n+ region to the p+ region during an electrostatic discharge event.

BRIEF DESCRIPTION OF THE DRAWINGS

In the accompanying drawings forming a material part of this description, there is shown.

DESCRIPTION OF THE PREFERRED EMBODIMENTS

The preferred embodiment discloses the application of the device of the present invention to ESD protection for an integrated circuit device. It should be clear to those experienced in the art that the present invention can be applied and extended without deviating from the scope of the present invention.

Figure 5:
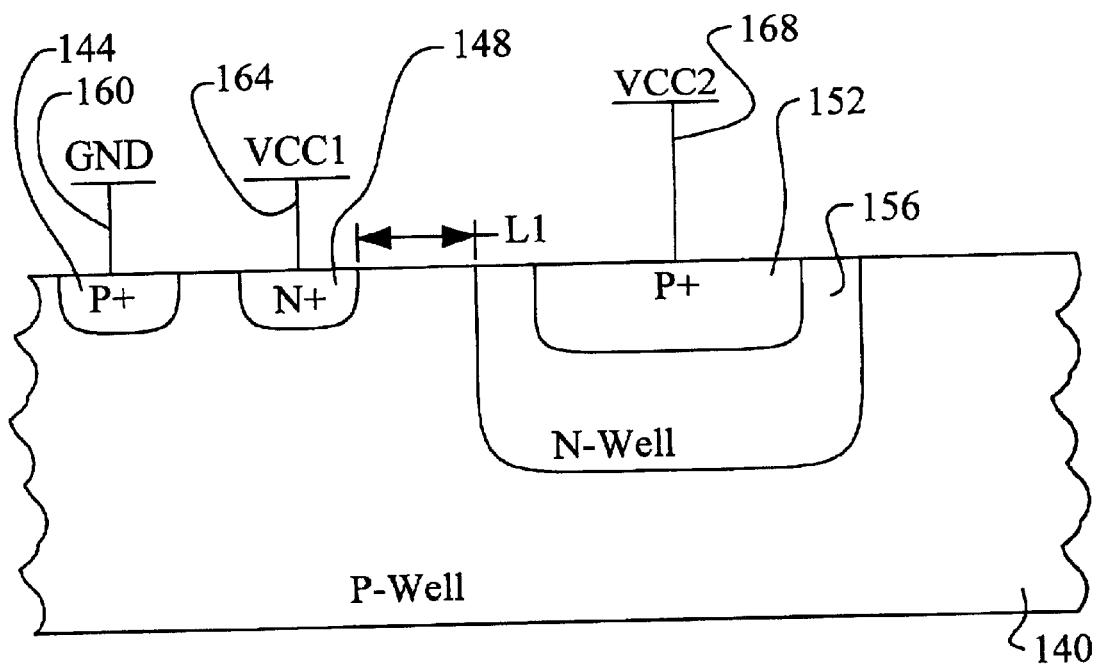
FIG. 5 illustrates in cross section the preferred embodiment of the present invention.

Referring now particularly to FIG. 5, there is shown a cross section of a partially completed integrated circuit device. Several important features of the present invention are illustrated. A semiconductor substrate 140 is provided. The semiconductor substrate 140 is herein shown entirely comprising a p-well layer 140. In practice, the p-well layer 140 may be formed in the bulk of the larger semiconductor substrate or the entire semiconductor substrate 140 may be lightly doped p-type. The p-well layer 140 is preferably doped to a concentration of between about $1\times10^{15}$ atoms/$cm^3$ and $1\times10^{16}$ atom/$cm^3$.

A p+ substrate contact region 144 provides an ohmic contact to the p-well region 140. This p+ substrate contact region is connected to the ground pin 160, or GND, of the integrated circuit device. During normal operation, the p-well region is therefore tied to the lowest voltage potential.

An n+ region 148 is formed in the p-well region 140. The n+ region 148 is connected to the first voltage supply 164 pin, VCC1, of the integrated circuit device. The first voltage supply 164 is higher voltage than the ground pin 160. Therefore, the p-n diode formed by the n+ region 148 and the p-well region 140 is reverse biased under normal operation conditions. The n+ region 148 may be formed in the p-well region 140 using, for example, an ion implantation process. The n+ region 148 preferably has a doping concentration of between about $1\times10^{20}$ atoms/$cm^3$ and $1\times10^{21}$ atoms/$cm^3$ and a depth of between about 0.1 Angstroms and 0.3 Angstroms.

An n-well region 156 is formed in the p-well region 140. The n-well region 156 is spaced apart from the n+ region 148 by lateral distance L1. The spacing L1 is specifically designed such that a depletion region will span the p-well region 140 between the n+ region 148 and the n-well region 156 during normal operation conditions. More specifically, the lateral distance L1 is between about 0.5 microns and 3.0 microns. The n-well region 156 may be formed in the p-well region 140 by, for example, an ion implantation and thermal drive in method. The n-well region preferably has a doping concentration of between about $5\times10^{15}$ atoms/$cm^3$ and $5\times10^{16}$ atoms/$cm^3$ and a depth of between about 0.3 Angstroms and 1.0 Angstroms.

A p+ region 152 is formed in the n-well region 156. The p+ region 152 is completely contained within the n-well region 156 as shown so that it is electrically isolated from the p-well region 140. The p+ region 168 is connected to the second voltage supply pin 168, or VCC2. During normal operation, the second voltage supply (VCC2) 168 is of greater value than the first voltage supply (VCC1) 164. The second supply voltage (VCC2) 168 is isolated from both the p-well region 140 and the first supply voltage (VCC1) by reverse biased p-n junctions. The p+ region preferably has a doping concentration of between about $1\times10^{20}$ atoms/$cm^3$ and $1\times10^{22}$ atoms/$cm^3$ and a depth of between about 0.1 Angstroms and 0.3 Angstroms.

The novel combination of doped regions illustrated in FIG. 5 forms an ESD protection device that may be called a depletion diode device. During normal operating conditions, there is no leakage path between the two supplies, VCC1 164 and VCC2 168. However, during an ESD event, the depletion diode device turns on such that current is conducted through the VCC2 node to the VCC1 node. In addition, because of the novel construction, the device can maintain a relatively large voltage differential between VCC2 and VCC1. The prior art single diode protection device could only support a small voltage differential (of about 0.7 Volts) before turning on. This is a significant advantage for the depletion diode device of the present invention.

Figure 6:
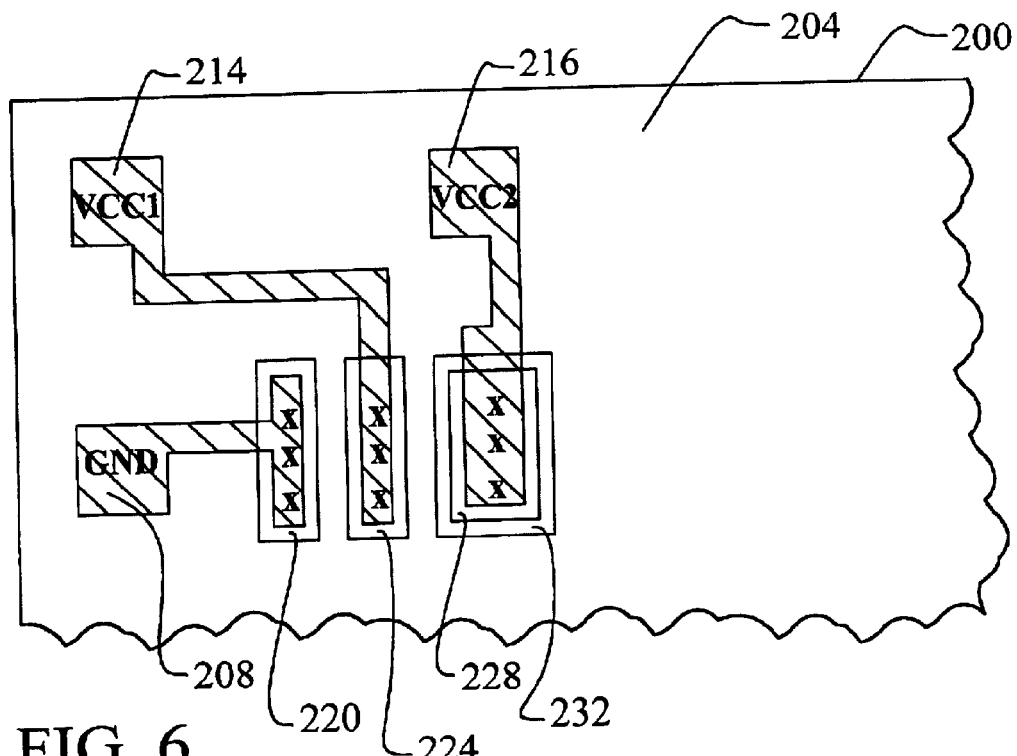
FIG. 6 illustrates a partial top view of the preferred embodiment of the present invention.

Referring now to FIG. 6, a partial top view of the preferred embodiment of the present invention is illustrated. The ESD protection device is used in a circuit 200 wherein a discharge path between the power supplies is created. The ground pad 208 of the integrated circuit 200 is tied externally to the ground reference, not shown. The ground pad 208 is tied internally to a p+ region 220 in the p-well region 204, which is shown here as encompassing the entire substrate 200. Two power supply voltages are used, VCC1 214 and VCC2 216. The VCC1 pad 212 is tied externally to the first (lower) supply. Internally, the VCC1 pad is connected to the n+ region 224 in the p-well region 204. The VCC2 pad 216 is tied externally to the second (upper) supply. Internally, the VCC2 pad is connected to the p+ region 228 in the n-well region 232. The n-well region 232 is contained within the p-well region 204. In this configuration, there is no leakage path between the VCC2 and VCC1 supplies during normal operation conditions. However, during an ESD event, the device turns ON and provides a low impedance path between VCC2 and VCC1.

Figure 7:
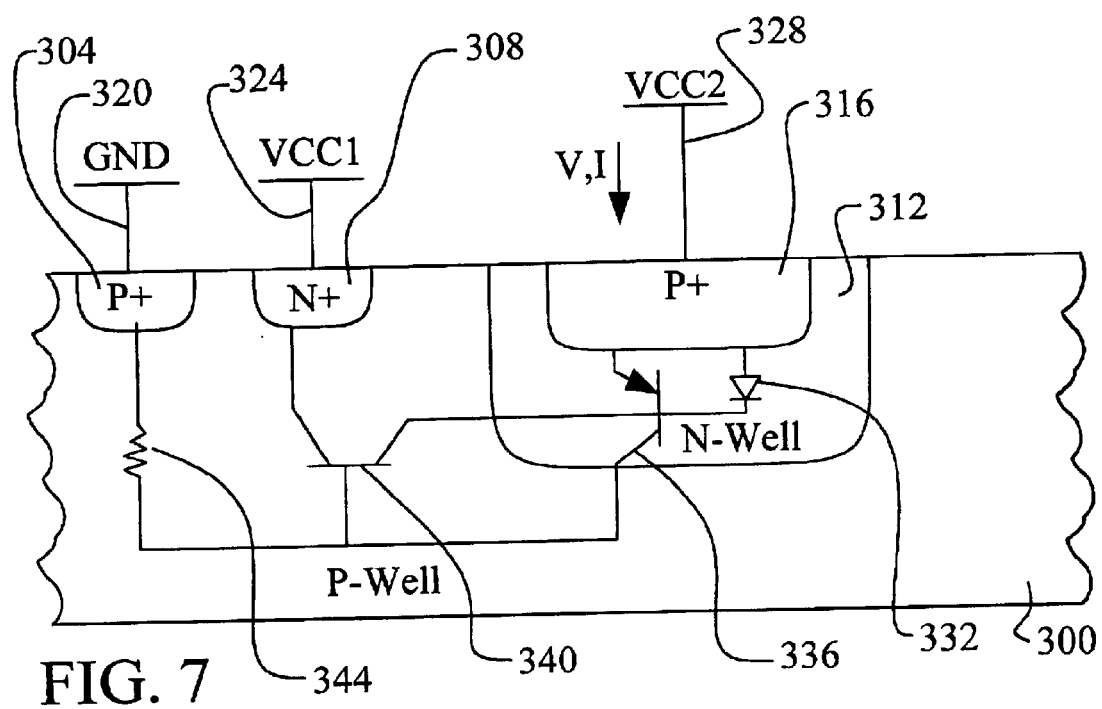
FIG. 7 illustrates in cross section the preferred embodiment of the present invention, including superimposed equivalent circuit elements, during normal operation conditions.

Referring now to FIG. 7, the device of the present invention is again shown in cross section. The equivalent circuit components formed by the interaction of the doped regions are added to the cross section. These equivalent circuit components are valid for the case of normal operation. During normal operation, the ground signal (GND) 320 is connected to the circuit ground, the first supply (VCC1) 324 is connected, and the second supply (VCC2) 328 is connected. Further, the second supply 328 is biased to a voltage above that of the first supply 324. The interrelated doped regions form an n-p-n transistor 340, a p-n-p transistor 336, a diode 332, and a bulk resistor 344.

Figure 1:
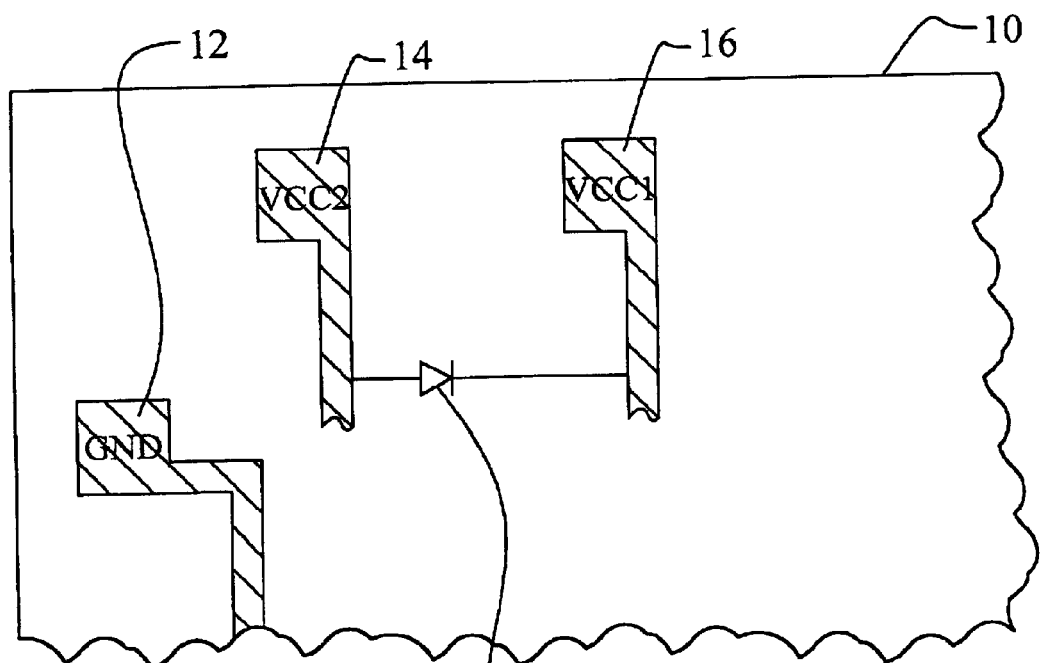
FIGS. 1 illustrates a partial top view of a prior art integrated circuit device die with an ESD diode.
Figure 2:
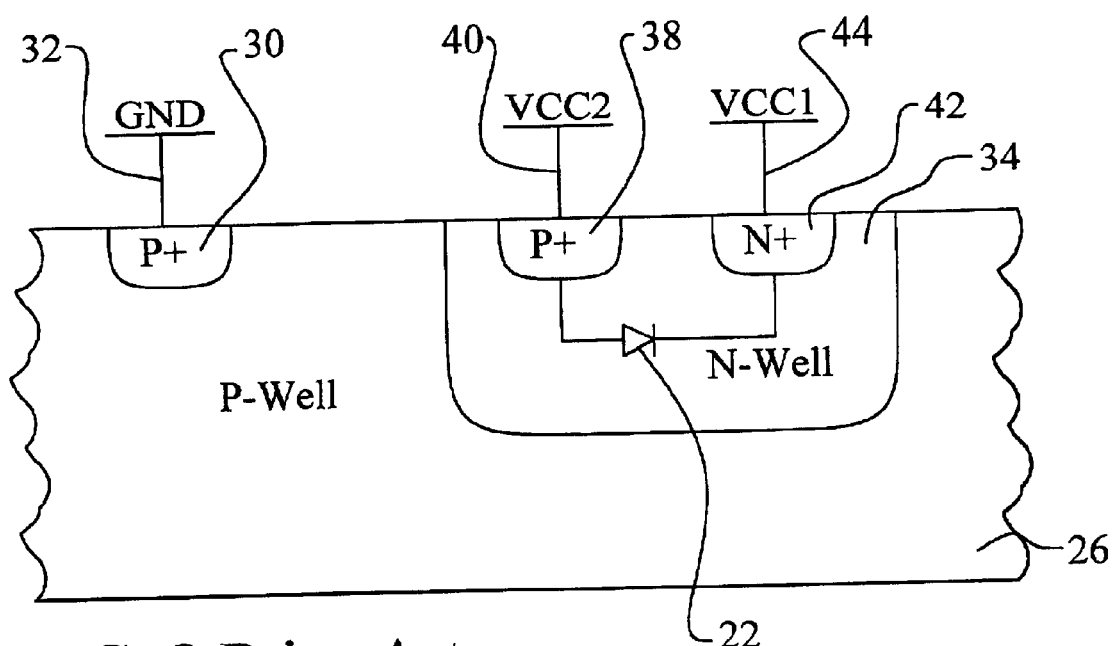
FIG. 2 illustrates in cross section a prior art ESD diode device.
Figure 3:
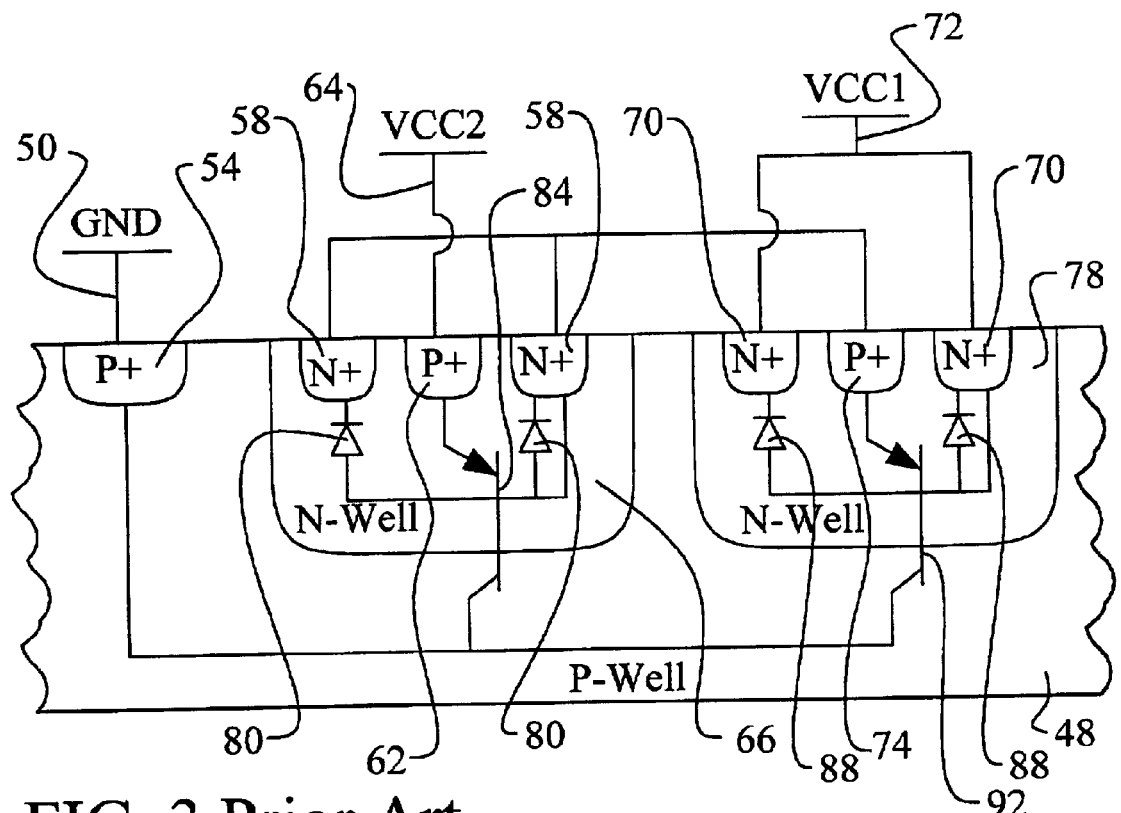
FIG. 3 illustrates in cross section a prior art ESD diode string.
Figure 4:
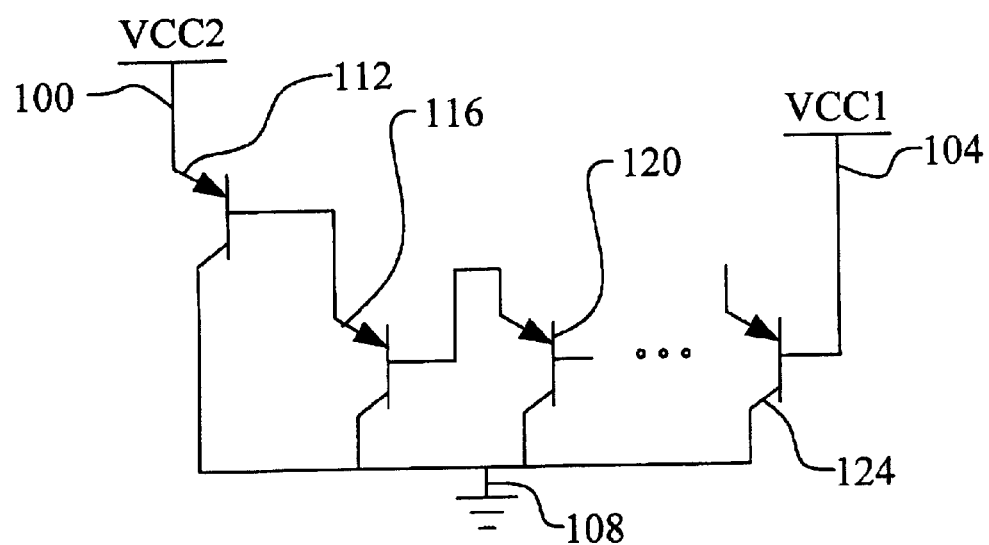
FIG. 4 illustrates the equivalent circuit for a prior art ESD diode string.
Figure 8:
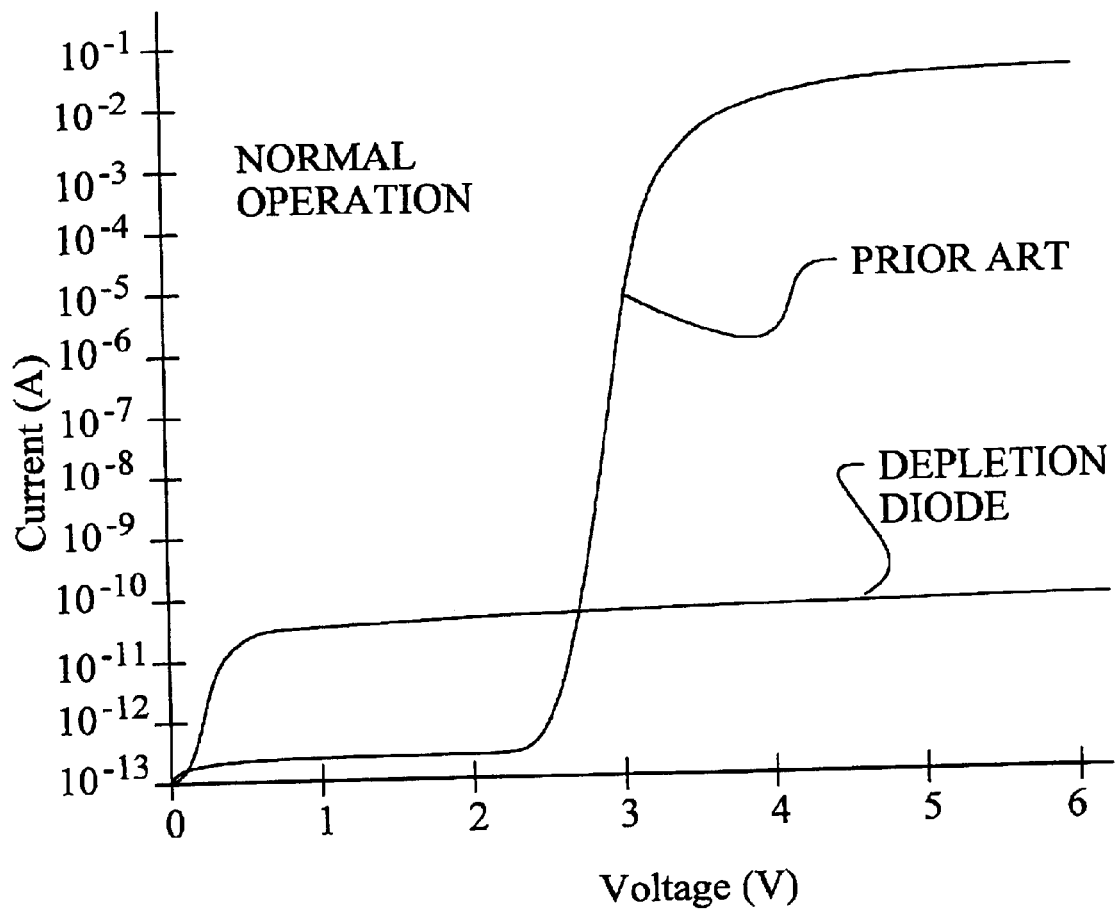
FIG. 8 illustrates the normal operating condition performance of the preferred embodiment of the present invention, labeled depletion diode, compared to the performance of the prior art diode device.

Referring now to FIG. 8, the normal operation performance of the protection device of the present invention and that of the prior art are compared. The prior art device of FIG. 2 and the present invention device of FIG. 7, are measured with the ground signal (GND) connected, the VCC1 signal connected to about 2.5 Volts and the VCC2 signal ramped up from about 0 Volts. Current flow between the supplies is charted against the voltage on the VCC2 signal. As expected, the prior art device begins to conduct significant current (exceeding 1 microAmp) when the VCC2 voltage reaches about 3.2 Volts. This is about 0.7 Volts above the VCC1 bias of 2.5 Volts. By comparison, the depletion diode turn on voltage is much higher. The depletion diode does not turn on until the VCC2 voltage reaches about 6 Volts. This means that the depletion diode has a turn on voltage of about 3.5 Volts. By comparison, a string of about 7 prior art diodes must be used to achieve the high turn on voltage of the device of the present invention. This represents a significant advantage in reduced complexity and die area. In the present invention, the preferred VCC1 voltage is between about 1.0 Volts and. 5.0 Volts. The preferred VCC2 voltage is between about 1.0 Volts and 5.0 Volts.

Figure 9:
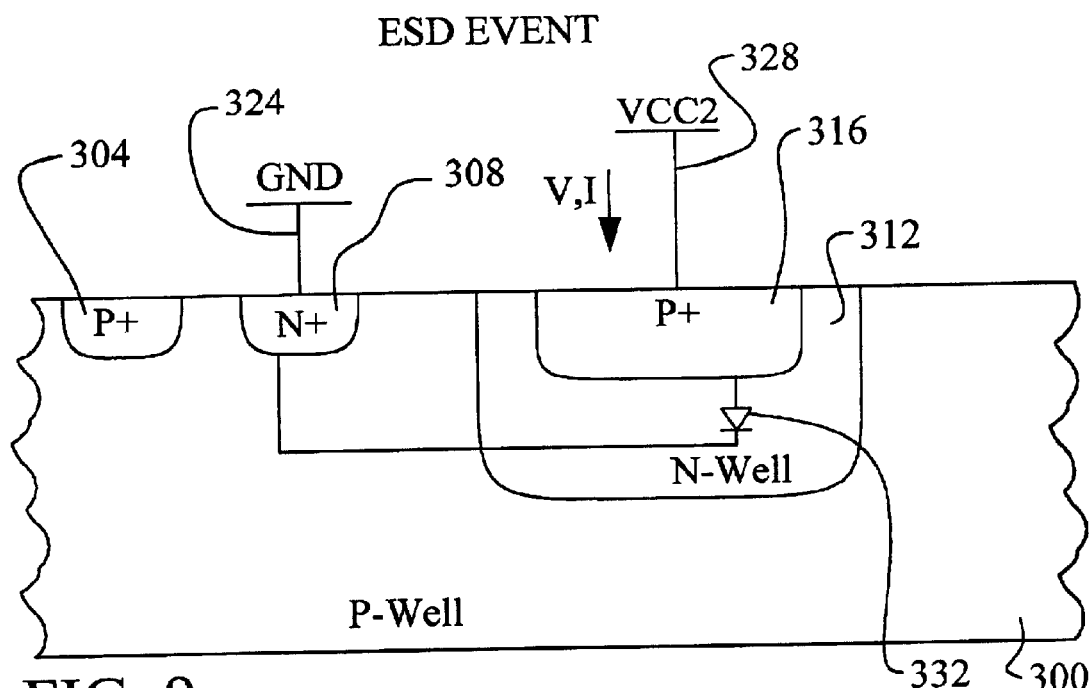
FIG. 9 illustrates in cross section the preferred embodiment of the present invention, including superimposed equivalent circuit elements, during an ESD event.

Referring now to FIG. 9, the cross section of the preferred embodiment of the present invention is again illustrated. The equivalent circuit for the device is added to show ESD event operation. During an ESD event, the ground pin of the integrated circuit device is left floating. The n+ region 308 is grounded. The VCC2 signal is ramped up to a large transient voltage. Without the protection device, the circuit could be ruined. However, the novel protection device performs as a forward biased p-n diode during the rapid transient pulse of the ESD event. It is believed that the unique structure, with the depletion region present, performs in a fashion similar to a p-n-p-n or silicon controlled rectifier (SCR) device.

Figure 10:
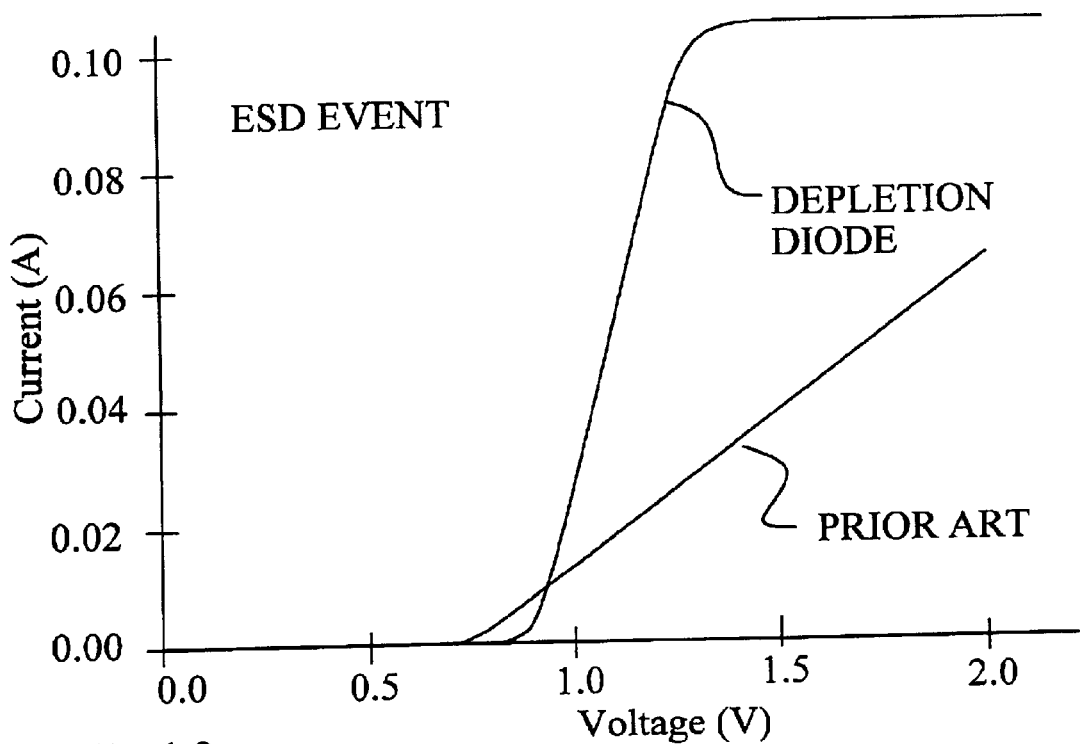
FIG. 10 illustrates the ESD event performance of the preferred embodiment of the present invention, labeled depletion diode, compared to the performance of the prior art diode device.

Referring now to FIG. 10, the ESD event performance of the depletion diode is compared to that of the prior art diode device. Note that both devices turn on as the voltage of the VCC2 pin increases to just below about 1 Volt. However, the novel device of the present invention exhibits a lower ON impedance. Therefore, the depletion diode device turns ON faster and protects the integrated circuit better. The novel protection structure of the present invention offers a reliability advantage for the integrated circuit application.

As shown in the preferred embodiments, the novel protection device and circuit of the present invention provides an effective and manufacturable alternative to the prior art. The new device facilitates the use of multiple power supplies on a single chip by improving the ESD protection capability for each supply pin. A larger voltage difference between supplies is possible without multiple diode strings.

While the invention has been particularly shown and described with reference to the preferred embodiments thereof, it will be understood by those skilled in the art that various changes in form and details may be made without departing from the spirit and scope of the invention.

What is claimed is:

1. An electrostatic discharge protection device consisting of:
   a p-well region in a semiconductor substrate;
   a ground pad connected to a first p+ region in said p-well region;
   an n+ region in said p-well region wherein said n+ region is connected to a first voltage supply;
   an n-well region in said p-well region wherein said n+ region is spaced from said n-well region a distance such that a depletion region extends therebetween during normal operation; and
   a second p+ region in said n-well region wherein said second p+ region is connected to a second voltage supply of greater value than said first voltage supply during said normal operation wherein current is conducted through said n+ region to said second p+ region during an electrostatic discharge event.

2. The device according to claim 1 wherein said p-well region comprises a dopant concentration of between about $1\times10^{15}$ atoms/cm$^3$ and $1\times10^{16}$ atoms/cm$^3$.

3. The device according to claim 1 wherein said n-well region comprises a dopant concentration of between about $5\times10^{15}$ atoms/cm$^3$ and $5\times10^{16}$ atoms/cm$^3$ and a junction depth of between about 0.3 microns and 1.0 microns.

4. The device according to claim 1 wherein said n+ region comprises a dopant concentration of between about $1\times10^{20}$ atoms/cm$^3$ and $1\times10^{22}$ atoms/cm$^3$ and a junction depth of between about 0.1 microns and 0.3 microns.

5. The device according to claim 1 wherein said distance between said n+ region and said n-well region is between about 0.2 microns and 1.0 microns.

6. The device according to claim 1 wherein said first voltage supply is between about 1.0 Volts and 5.0 Volts referenced to said p-well region during said normal operation.

7. The device according to claim 1 wherein said second voltage supply is between about 1.0 Volts and 5.0 Volts referenced to said p-well region during said normal operation.

8. An electrostatic discharge protection device consisting of:
   a p-well region in a semiconductor substrate;
   a ground pad connected to a first p+ region in said p-well region;
   an n+ region in said p-well region wherein said n+ region is connected to a first voltage supply;
   an n-well region in said p-well region wherein said n+ region is spaced from said n-well region a distance such that a depletion region extends therebetween during normal operation and wherein said distance between said n+ region and said n-well region is between about 0.2 microns and 1.0 microns; and
   a second p+ region in said n-well region wherein said second p+ region is connected to a second voltage supply of greater value than said first voltage supply during said normal operation wherein current is conducted through said n+ region to said second p+ region during an electrostatic discharge event.

9. The device according to claim 8 wherein said p-well region comprises a dopant concentration of between about $1 \times 10^{15}$ atoms/cm$^3$ and $1 \times 10^{16}$ atoms/cm$^3$.

10. The device according to claim 8 wherein said n-well region comprises a dopant concentration of between about $5 \times 10^{15}$ atoms/cm$^3$ and $5 \times 10^{16}$ atoms/cm$^3$ and a junction depth of between about 0.3 microns and 1.0 microns.

11. The device according to claim 8 wherein said n+ region comprises a dopant concentration of between about $1 \times 10^{20}$ atoms/cm$^3$ and $1 \times 10^{22}$ atoms/cm$^3$ and a junction depth of between about 0.1 microns and 0.3 microns.

12. The device according to claim 8 wherein said first voltage supply is between about 1.0 Volts and 5.0 Volts referenced to said p-well region during said normal operation.

13. The device according to claim 8 wherein said second voltage supply is between about 1.0 Volts and 5.0 Volts referenced to said p-well region during said normal operation.

14. An electrostatic discharge protection circuit on an integrated circuit device, said protection circuit consisting of:
   a ground pad connected to a first p+ region in a p-well in a substrate;
   a first voltage supply pad connected to an external first voltage supply and to an n+ region in said p-well; and
   a second voltage supply pad connected to an external second voltage supply of greater value than said external first voltage supply during normal operation and to a second p+ region in an n-well region in said p-well region wherein said n+ region is spaced from said n-well region a distance such that a depletion region extends therebetween during said normal operation, and wherein current is conducted through said external second voltage supply pad to said external first voltage supply pad during an electrostatic discharge event.

15. The device according to claim 14 wherein said p-well region comprises a dopant concentration of between about $1 \times 10^{15}$ atoms/cm$^3$ and $1 \times 10^{16}$ atoms/cm$^3$.

16. The device according to claim 14 wherein said n-well region comprises a dopant concentration of between about $5 \times 10^{15}$ atoms/cm$^3$ and $5 \times 10^6$ atoms/cm$^3$ and a junction depth of between about 0.3 microns and 1.0 microns.

17. The device according to claim 14 wherein said n+ region comprises a dopant concentration of between about $1 \times 10^{20}$ atoms/cm$^3$ and $1 \times 10^{22}$ atoms/cm$^3$ and a junction depth of between about 0.1 microns and 0.3 microns.

18. The device according to claim 14 wherein said distance between said n+ region and said n-well region is between about 0.3 microns and 1.0 microns.

19. The device according to claim 14 wherein said external first voltage supply is between about 1.0. Volts and 5.0 Volts referenced to said p-well region during said normal operation.

20. The device according to claim 14 wherein said external second voltage supply is between about 1.0 Volts and 5.0 Volts referenced to said p-well region during said normal operation.

* * * * *